United States Patent
Kawabata

(10) Patent No.: US 7,910,977 B2
(45) Date of Patent: Mar. 22, 2011

(54) SEMICONDUCTOR STORAGE ELEMENT AND MANUFACTURING METHOD THEREOF

(75) Inventor: Kenji Kawabata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 242 days.

(21) Appl. No.: 11/947,428

(22) Filed: Nov. 29, 2007

(65) Prior Publication Data

US 2008/0272425 A1 Nov. 6, 2008

(30) Foreign Application Priority Data

Nov. 30, 2006 (JP) ................................. 2006-324445

(51) Int. Cl.
*H01L 29/788* (2006.01)

(52) U.S. Cl. . 257/321; 257/324; 257/325; 257/E29.301; 257/E49.003; 438/263; 438/288; 977/396; 977/943

(58) Field of Classification Search .................. 257/321, 257/324, 325, E29.301, E49.003, 4, 278; 438/263, 288; 977/936, 943
See application file for complete search history.

(56) References Cited

U.S. PATENT DOCUMENTS

| 6,165,842 A | 12/2000 | Shin et al. | |
|---|---|---|---|
| 6,894,352 B2 | 5/2005 | Hu et al. | |
| 2002/0068406 A1* | 6/2002 | Ishii | 438/275 |
| 2002/0167002 A1 | 11/2002 | Chae et al. | |
| 2003/0153151 A1 | 8/2003 | Choi et al. | |
| 2005/0142753 A1* | 6/2005 | Koh | 438/257 |
| 2005/0179079 A1* | 8/2005 | Wu | 257/316 |
| 2006/0118853 A1* | 6/2006 | Takata et al. | 257/314 |
| 2006/0267073 A1* | 11/2006 | Kato et al. | 257/315 |
| 2006/0275984 A1* | 12/2006 | Liu et al. | 438/257 |

FOREIGN PATENT DOCUMENTS

JP 2004-343128 12/2004

OTHER PUBLICATIONS

Yano et al., "Single-Electron Memory for Giga-to-Tera Bit Storage," Proceedings of the IEEE (Apr. 1999), 87:633-651.
K. Gopalakrishnan, et al., "The Micro to Nano Addressing Block (MNAB)", Proceedings of the IEEE, 4 pages (2005).
"IBM Non-Lithography Ultra Nanotechnology", 2005 IEEE International Electron Device Meeting (2005 IEDM), Lecture No. 19.4, Nikkei Microdevices, Nikkei BP Corp., p. 3 (Jan. 2006).

* cited by examiner

*Primary Examiner* — Tu-Tu V Ho
(74) *Attorney, Agent, or Firm* — Finnegan, Henderson, Farabow, Garrett & Dunner, L.L.P.

(57) ABSTRACT

A semiconductor storage element includes: a semiconductor layer constituted of a line pattern with a predetermined width formed on a substrate; a quantum dot forming an electric charge storage layer formed on the semiconductor layer through a first insulating film serving as a tunnel insulating film; an impurity diffusion layer formed in a surface layer of the semiconductor layer so as to sandwich the quantum dot therebetween; and a control electrode formed on the quantum dot through a second insulating film.

6 Claims, 19 Drawing Sheets

SEMICONDUCTOR STORAGE ELEMENT AND MANUFACTURING METHOD THEREOF

CROSS REFERENCE TO RELATED APPLICATION

This application claims benefit of priority under 35 USC §119 to Japanese patent application No. 2006-324445, filed on Nov. 30, 2006, the contents of which are incorporated by reference herein.

BACKGROUND OF THE INVENTION

1. Field of the Invention

The present invention relates to a semiconductor storage element and a manufacturing method thereof, and intended for, e.g., a mass-producible single-electron memory element.

2. Related Background Art

In order to realize a single-electron memory that can operate at a room temperature, various proposals have been made. For example, Japanese patent laid open No. 2004-343128 proposes, e.g., a method of manufacturing a single-electron memory element having quantum dots as grains each having a diameter of 6 nm by annealing amorphous silicon having a dimension of 20 nm (in thickness)×150 nm to be recrystallized. However, according to the method disclosed in Japanese patent laid open No. 2004-343128, an element is devoid of uniformity, and hence stable mass production is difficult.

Further, U.S. Pat. No. 6,894,352 B2 proposes a single-electron transistor which has quantum dots of 80 nm or below contained in an electric field and is operable at an experimental stage. However, this single-electron transistor must be manufactured by using EB (Electron Beam) lithography, and hence it has a drawback that mass production is difficult.

PROCEEDINGS OF THE IEEE Vol. 87 No. 4, April 1999 (which will be referred to as "Non-patent Document 1" hereinafter) discloses the world's first single-electron memory that operates at a room temperature, and natural formation of an extra-fine current path or an electric charge storage region that is as thin as a crystal grain is realized as shown in FIG. 35 by utilizing irregularities of a polysilicon film.

However, an element according to Non-patent Document 1 has a drawback that not only process controllability is insufficient but also peripheral circuits become large. For example, an unevenness compensation circuit is required.

2005 IEEE International Electron Device Meeting (2005 IEDM), Lecture No. 19.4 (which will be referred to as "Non-patent Document 2" hereinafter) proposes a memory cell having a two-dimensional structure by arranging thin lines lengthwise and crosswise and providing four gates. However, since an element in Non-patent Document 2 likewise requires EB exposure, it has a drawback that mass production is difficult.

SUMMARY OF THE INVENTION

According to a first aspect of the present invention, there is provided a semiconductor storage element comprising:

a semiconductor layer constituted of a line pattern with a predetermined width formed on a substrate;

a quantum dot forming an electric charge storage layer formed on the semiconductor layer through a first insulating film serving as a tunnel insulating film;

an impurity diffusion layer formed in a surface layer of the semiconductor layer so as to sandwich the quantum dot therebetween; and a control electrode formed on the quantum dot through a second insulating film.

According to a second aspect of the present invention, there is provided a manufacturing method of a semiconductor storage element comprising:

forming a first frame body having a substantially rectangular planar shape on a substrate through a first insulating film by sidewall mask processing, a longitudinal direction of the first frame body being determined in a first direction within a surface of the substrate and each side of the first frame body being constituted of a semiconductor line pattern with a predetermined width;

forming a second frame body having a substantially rectangular planar shape on the substrate by sidewall mask processing in such a manner that the second frame body crosses the first frame body to form a crisscross planar shape, a longitudinal direction of the second frame body being determined in a second direction perpendicular to the first direction within the surface of the substrate and each side of the second frame body being constituted of a line pattern with a predetermined width;

forming a quantum dot serving as an electric storage layer at an intersection of the first frame body and the second frame body on the substrate through a tunnel insulating film by selectively removing the first frame body and the first insulating film using the second frame body as a mask; and removing the second frame body.

BRIEF DESCRIPTION OF THE DRAWINGS

In accompanying drawings.

DETAILED DESCRIPTION OF THE INVENTION

An embodiment according to the present invention will now be explained hereinafter with reference to the accompanying drawings.

Figure 1:
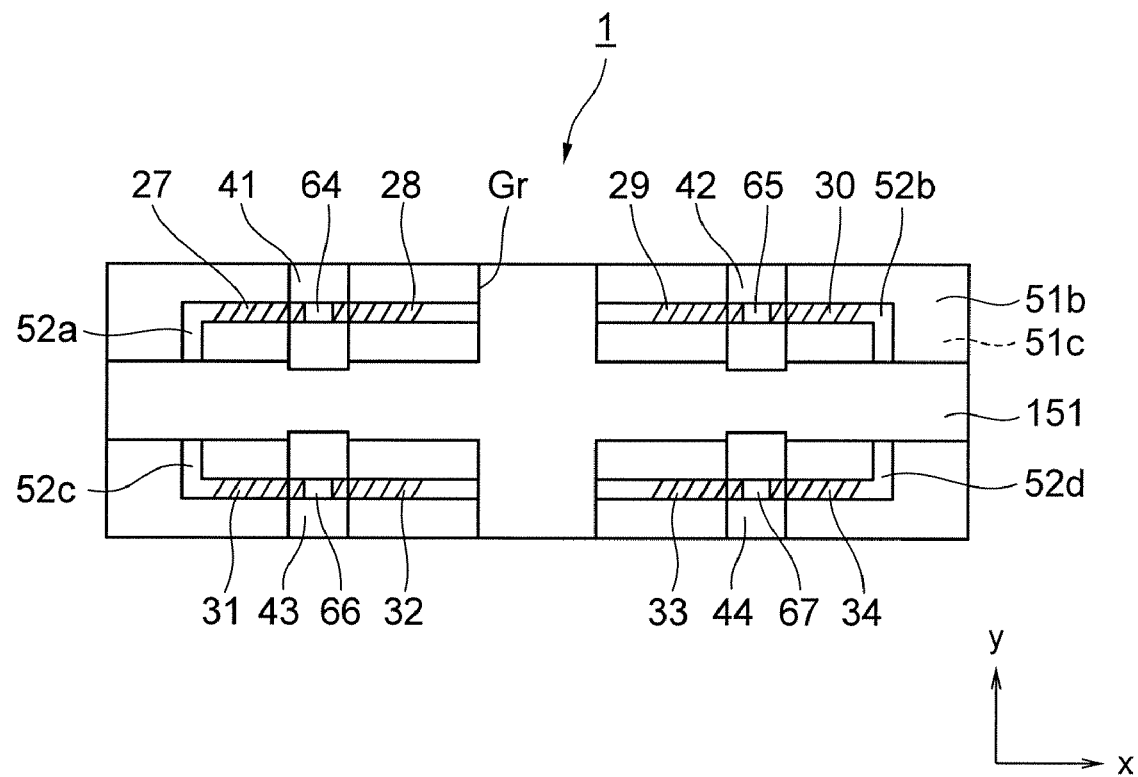
FIG. 1 is a plan view showing a semiconductor storage element according to an embodiment of the present invention.

FIG. 1 is a plan view showing a semiconductor storage element as an embodiment according to the present invention. A semiconductor storage element 1 depicted in this drawing is constituted of four memory cells formed on element regions of a surface layer of a semiconductor substrate 51c subjected to element isolation by an STI (Shallow Trench Insulator) formed by filling an element isolation groove Gr with an insulating film 151. Silicon patterns 52a to 52d are formed in the respective element regions on the semiconductor substrate 51 through an oxide film 51b, thereby constituting a channel region. Each of the silicon patterns 52a to 52d is formed with a predetermined width of a nano scale and its width is 5 nm in this embodiment. Quantum dots 64 to 67 covered with an oxide film are formed in substantially central regions of the respective silicon patterns 52a to 52d to constitute electric charge storage layers. Of the oxide film covering the quantum dots 64 to 67, the oxide film between the quantum dots 64 to 67 and the silicon patterns 52a to 52d corresponds to, e.g., a first insulating film forming a tunnel insulating film in this embodiment. Impurity diffusion layers 27 to 34 forming sources/drains are formed in the silicon patterns 52a to 52d so as to sandwich the substantial central region of the respective silicon patterns 52a to 52d below the quantum dots 64 to 67 therebetween. Further, gate electrodes (control electrodes) 41 to 44 are formed on the quantum dots 64 to 67, respectively.

It is to be noted that the example of having the four memory cells has been explained above for simplicity, but the present invention is not of course restricted to this conformation, and many memory cells are usually formed in x and y directions in FIG. 1 at a predetermined pitch.

A manufacturing method of the semiconductor storage element 1 depicted in FIG. 1 will now be explained with reference to FIGS. 2 to 34.

Figure 2:
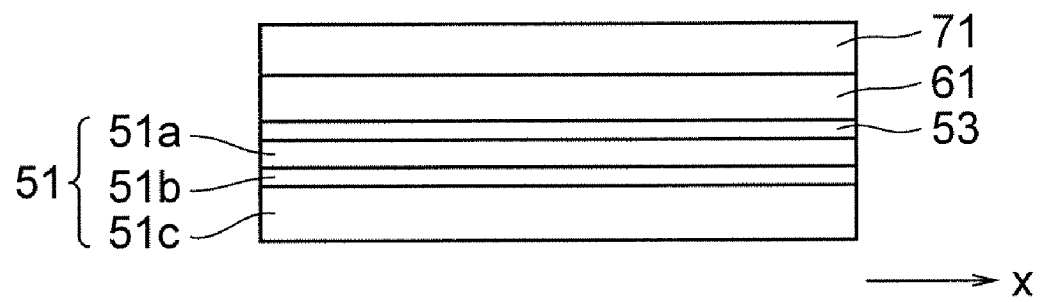
FIG. 2 is a partial cross-sectional view for explaining a manufacturing method of the semiconductor storage element depicted in FIG. 1.
Figure 3:
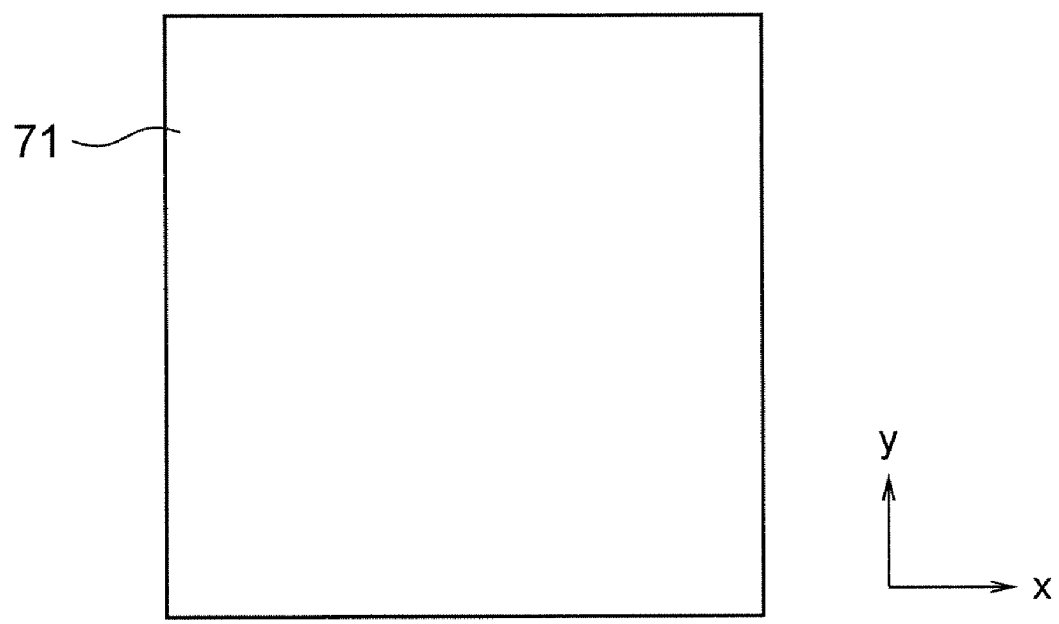
FIG. 3 is a partial plan view for explaining the manufacturing method of the semiconductor storage element depicted in FIG. 1.

First, as shown in a cross-sectional view of FIG. 2, a silicon oxide film 53, a polysilicon film 61 and a nitride film 71 are sequentially formed on an SOI substrate 51. The SOI substrate 51 is constituted of a laminated body including a silicon layer 51c, an oxide film 51b and a silicon single-crystal film 51a, and the silicon single-crystal film 51a in an uppermost layer becomes a channel region of the semiconductor storage element by subsequent etching processing. The substrate is not restricted to the SOI. The same quantum dots can be formed on, e.g., a silicon substrate. However, as explained above, since a thin line part (a part denoted by reference numeral 51a in FIG. 30) on a substrate surface engraved by etching finally becomes a channel region, it can be expected that characteristics are improved when the SOI substrate having an excellent electron transport efficiency of the channel is used. The polysilicon film 61 is a substance that becomes the quantum dot by subsequent processing. A thickness of the polysilicon film 61 and an oxidation amount of thermal oxidation processing (see FIG. 33) determine a height of the quantum dot. Here, a quantum effect becomes prominent as a size of the quantum dot becomes smaller. At the present day, the size of the quantum dot formed of a silicon material must be set to approximately 5 nm or below in order to operate the quantum dot at a room temperature. The thickness of the polysilicon film 61 in this embodiment is also set to 5 nm in accordance with this size. A thickness of the nitride film 71 is 10 nm in this embodiment. FIG. 3 is an element plane view on a manufacturing stage depicted in FIG. 2.

Figure 4:
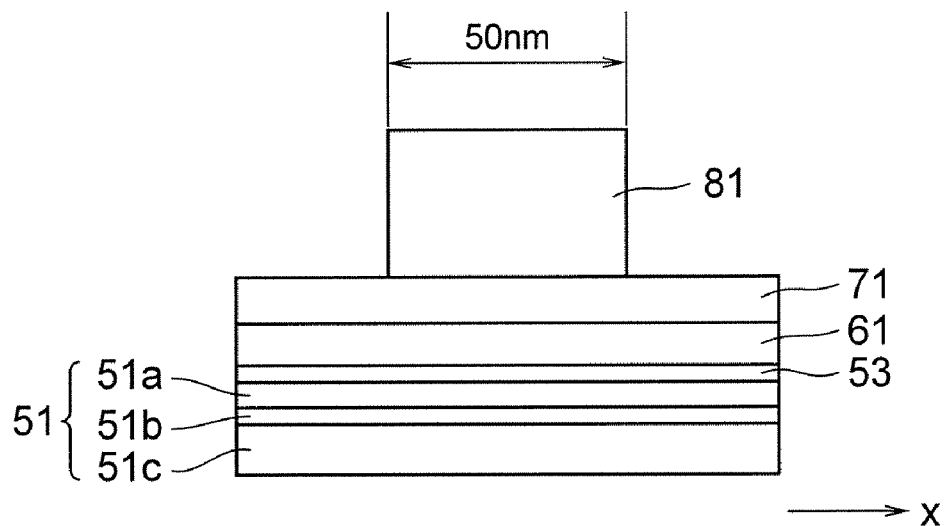
FIG. 4 is a partial cross-sectional view for explaining the manufacturing method of the semiconductor storage element depicted in FIG. 1.
Figure 5:
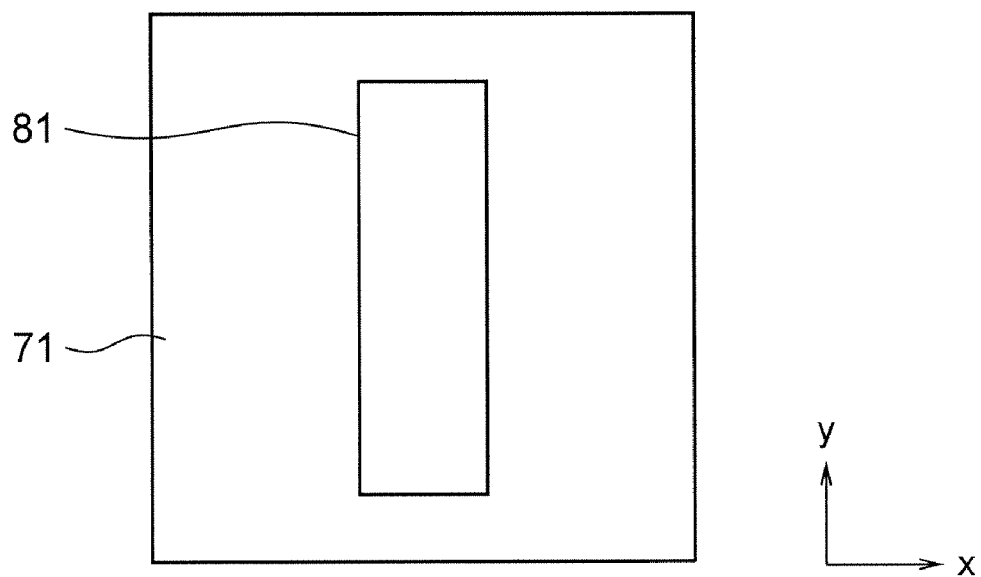
FIG. 5 is a partial plan view for explaining the manufacturing method of the semiconductor storage element depicted in FIG. 1.

Then, an insulating film formed of a TEOS (Tetra Ethoxy Silage) film is deposited with a thickness of 30 nm on the nitride film 71, and then this film is selectively removed by patterning using a resist, thereby forming a line pattern 81 with a width of 50 nm as shown in a cross-sectional view of FIG. 4. The line pattern 81 is formed with the y direction being determined as a longitudinal direction thereof as shown in a plan view of FIG. 5. The y direction corresponds to, e.g., a first direction in this embodiment.

Figure 6:
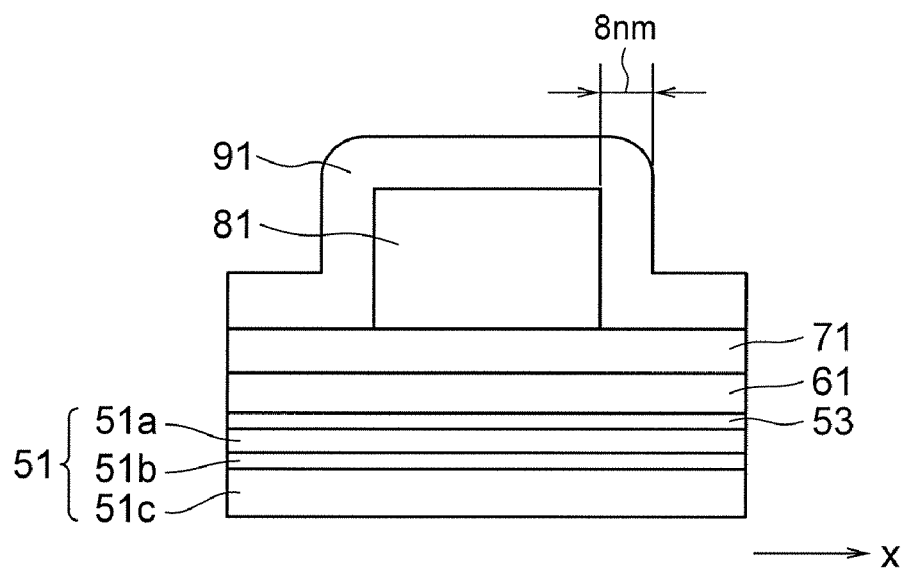
FIG. 6 is a partial cross-sectional view for explaining the manufacturing method of the semiconductor storage element depicted in FIG. 1.
Figure 7:
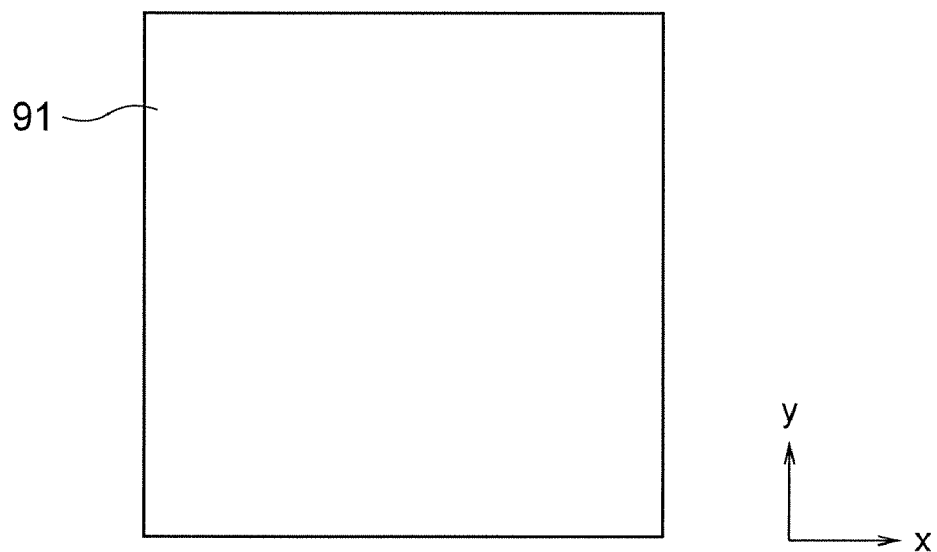
FIG. 7 is a partial plan view for explaining the manufacturing method of the semiconductor storage element depicted in FIG. 1.

Subsequently, as shown in a cross-sectional view of FIG. 6, an amorphous silicon film 91 is formed on an entire surface. FIG. 7 shows its plan view. Here, a thickness of the amorphous silicon film 91 is 8 nm.

Figure 8:
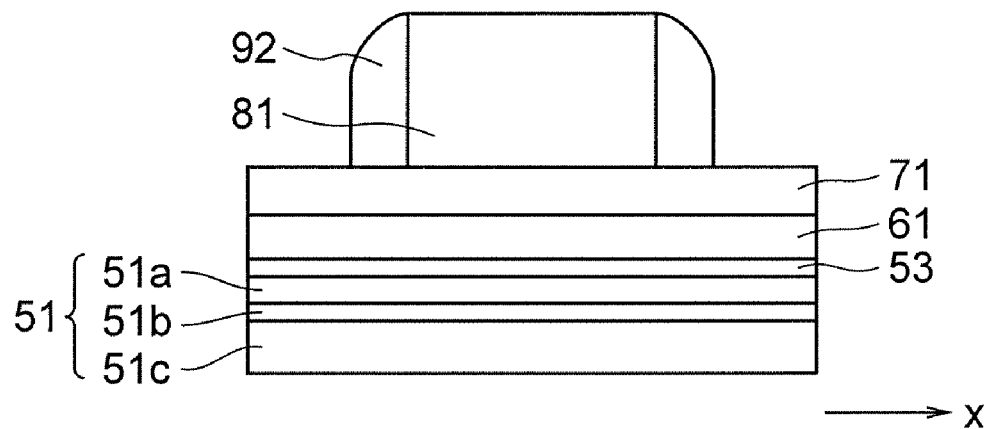
FIG. 8 is a partial cross-sectional view for explaining the manufacturing method of the semiconductor storage element depicted in FIG. 1.
Figure 9:
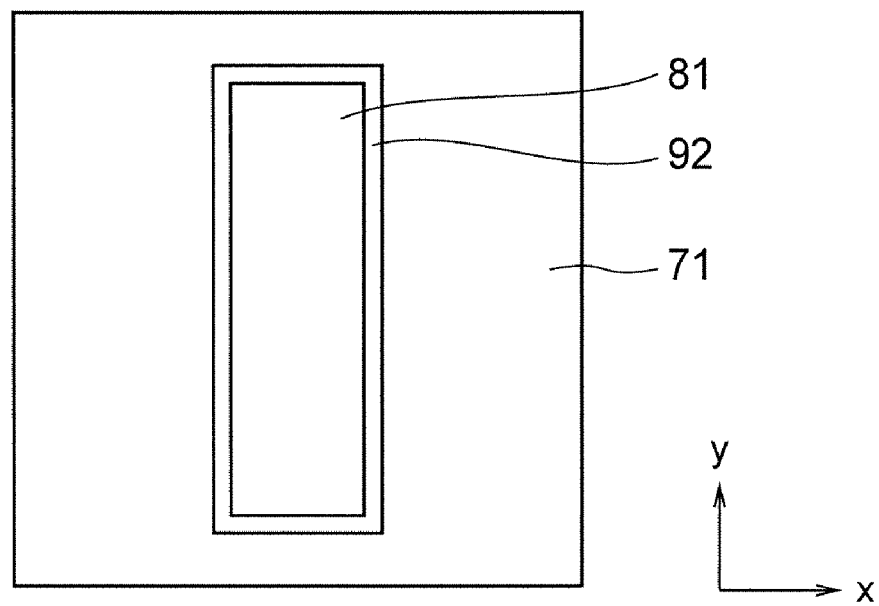
FIG. 9 is a partial plan view for explaining the manufacturing method of the semiconductor storage element depicted in FIG. 1.

Furthermore, as shown in a cross-sectional view of FIG. 8, when a flat surface portion of the amorphous silicon film 91 is selectively removed by anisotropic etching, a sidewall portion alone of the line pattern 81 is left to obtain a sidewall film 92. FIG. 9 is a plan view of this stage. As shown in this drawing, the sidewall film 92 remains on the nitride film 71 in such a manner that each side forms a rectangular frame shape constituted of the line pattern having a predetermined width.

Figure 10:
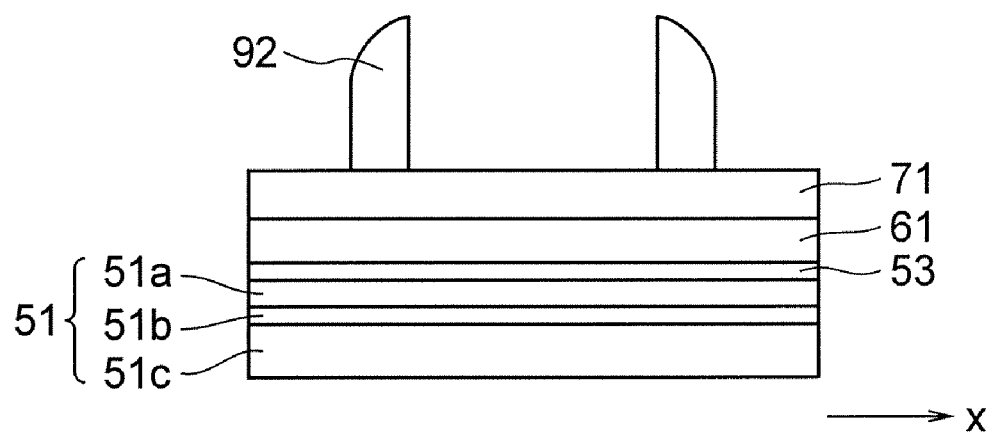
FIG. 10 is a partial cross-sectional view for explaining the manufacturing method of the semiconductor storage element depicted in FIG. 1.
Figure 11:
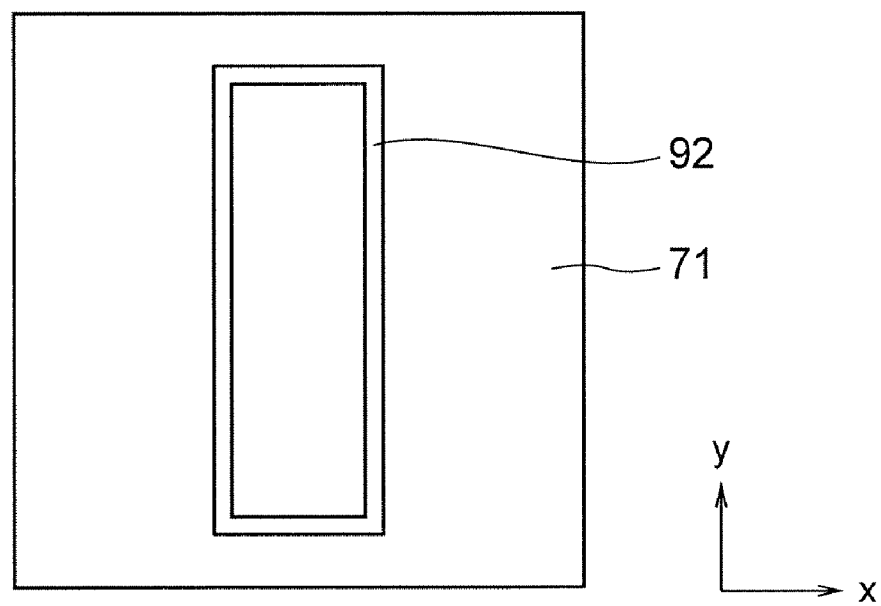
FIG. 11 is a partial plan view for explaining the manufacturing method of the semiconductor storage element depicted in FIG. 1.

Then, as shown in a cross-sectional view of FIG. 10, the line pattern 81 is selectively removed by wet etching to leave the amorphous silicon film 91 alone, thereby providing the sidewall film 92. FIG. 11 is a plan view of this stage.

Figure 12:
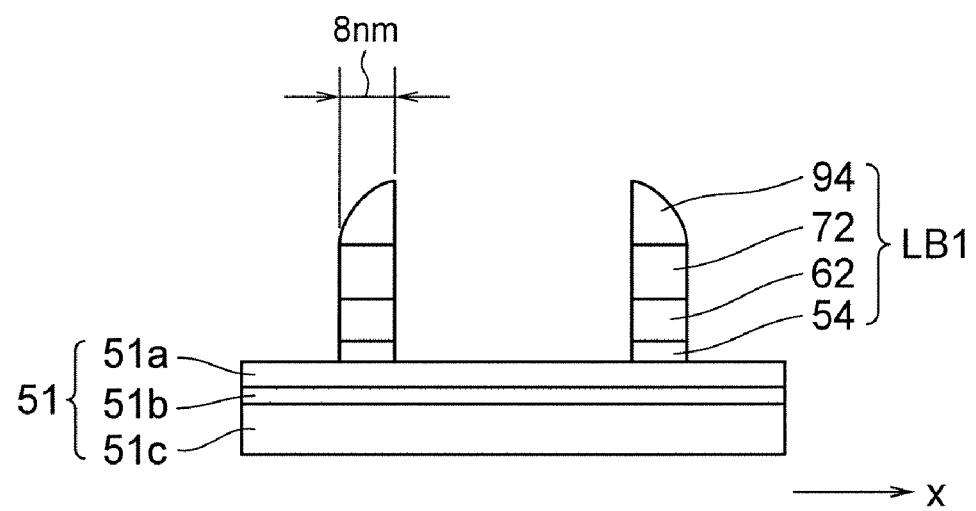
FIG. 12 is a partial cross-sectional view for explaining the manufacturing method of the semiconductor storage element depicted in FIG. 1.
Figure 13:
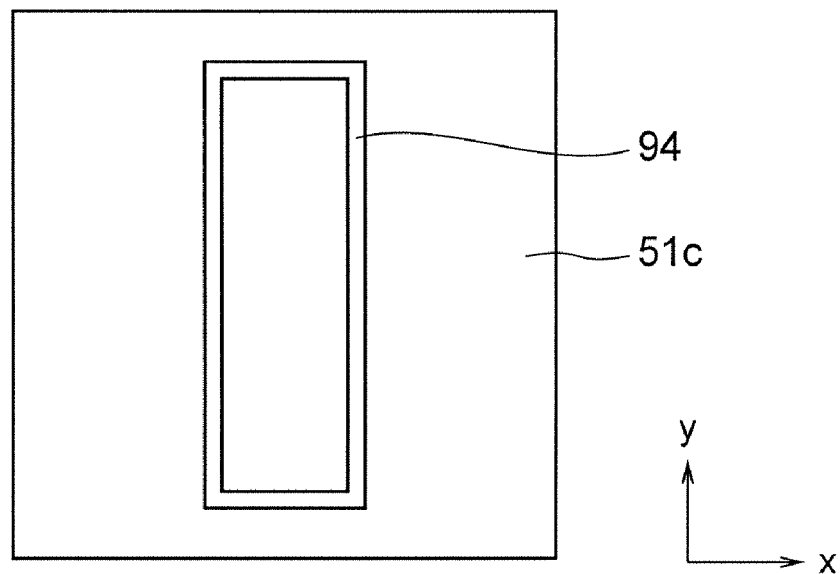
FIG. 13 is a partial plan view for explaining the manufacturing method of the semiconductor storage element depicted in FIG. 1.

Subsequently, the underlying nitride film 71, the polysilicon film 61 and silicon oxide film 53 are selectively removed by anisotropic etching using the sidewall film 92 being used as a mask. As a result of this anisotropic etching, as can be understood from a cross-sectional view of FIG. 12 and a plan view of FIG. 13, a laminated body LB 1 having a rectangular shape as seen in a plan view as a laminated body constituted of the silicon oxide film 54, the polysilicon film 62, the nitride film 72 and the amorphous silicon film 94 is formed. A process of forming the sidewall film and using this film as a mask to perform etching in this manner is called a sidewall mask manufacturing process. At this time, an etching selection ratio must be set in such a manner that the amorphous silicon film 94 and the nitride film 72 sufficiently remain as a mask material. Moreover, if such an etching selection ratio can be assured, a combination of the amorphous silicon film 94 and the nitride film 72 may be substituted by a combination of films formed of other materials. A line width of the laminated body LB 1 depicted in FIGS. 12 and 13 is dependent on a width of the amorphous silicon film 94 as a sidewall mask, and it is 8 nm in this embodiment. Since the width of the amorphous silicon film 94 and an oxidation amount of subsequent thermal oxidation processing (see FIG. 14) determine a size of the quantum dot in the x direction, reducing a film thickness of the amorphous silicon film 94 enables decreasing the size of the quantum dot.

Figure 14:
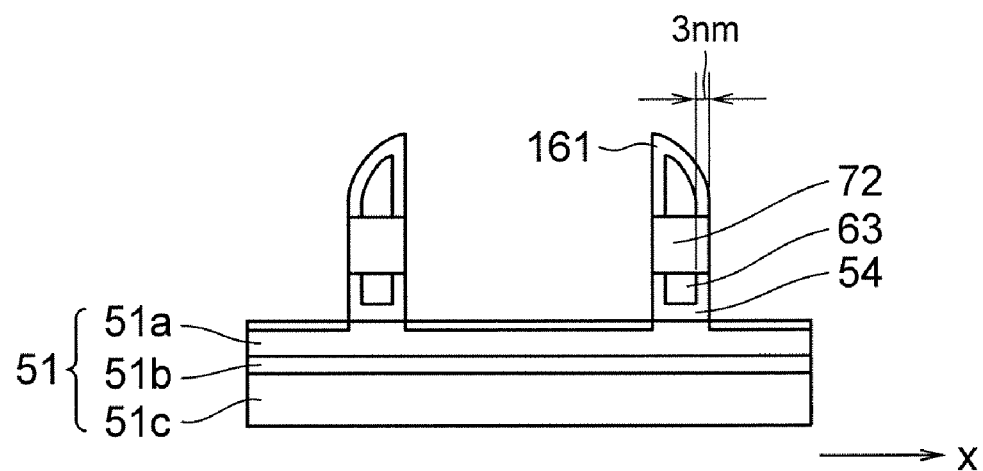
FIG. 14 is a partial cross-sectional view for explaining the manufacturing method of the semiconductor storage element depicted in FIG. 1.
Figure 15:
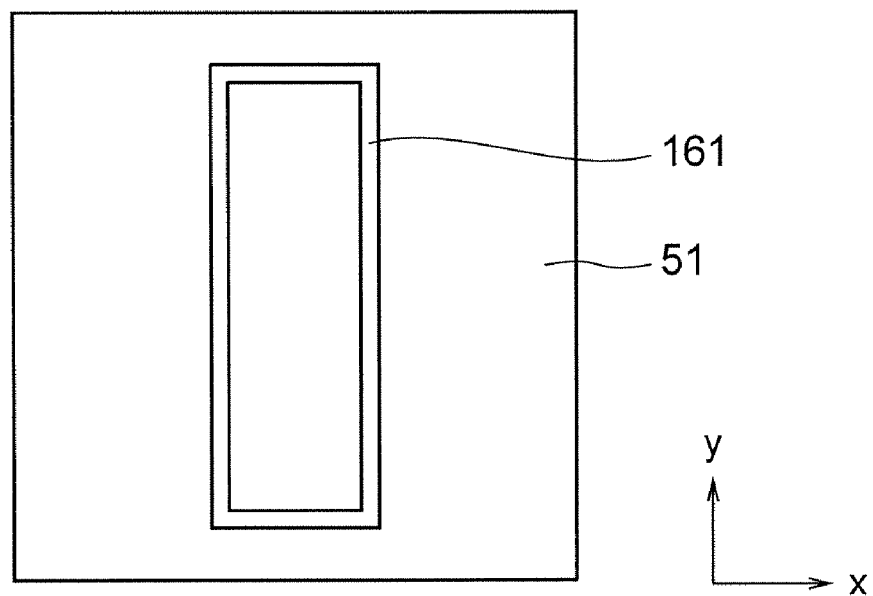
FIG. 15 is a partial plan view for explaining the manufacturing method of the semiconductor storage element depicted in FIG. 1.

Then, as shown in a cross-sectional view of FIG. 14 and a plan view of FIG. 15, thermal oxidation processing is performed with respect to the entire surface. As a result, the sidewall of the polysilicon 62 as the quantum dot, the sidewall of the polysilicon film 94 as the sidewall mask, and the surface of the SOI substrate 51 are oxidized. As a result, the polysilicon 62 becomes a polysilicon thin line 63 whose sidewall is covered with an oxide film 161. The polysilicon thin line 63 corresponds to, e.g., a first frame body in this embodiment. Here, when an amount of thermal oxidation is selected to provide a thickness of 3 nm, the polysilicon thin line 63 is formed with a predetermined width of 5 nm.

Figure 16:
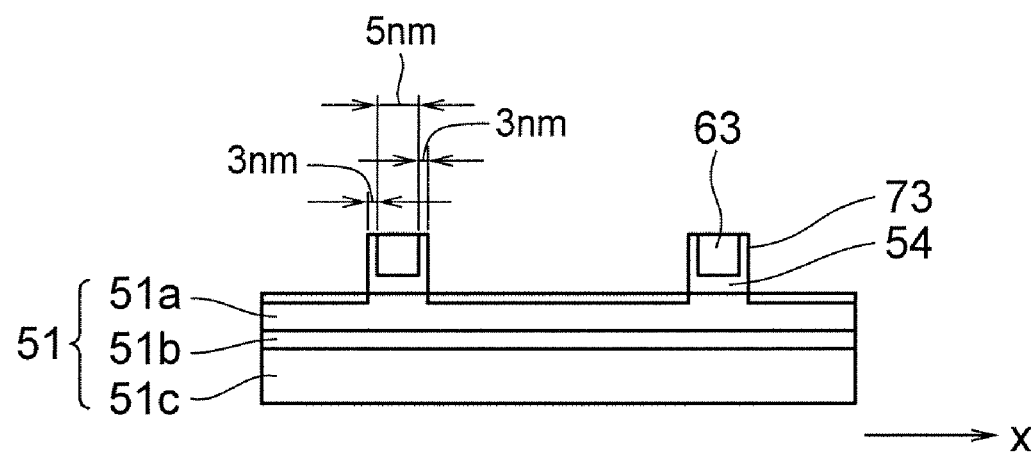
FIG. 16 is a partial cross-sectional view for explaining the manufacturing method of the semiconductor storage element depicted in FIG. 1.
Figure 17:
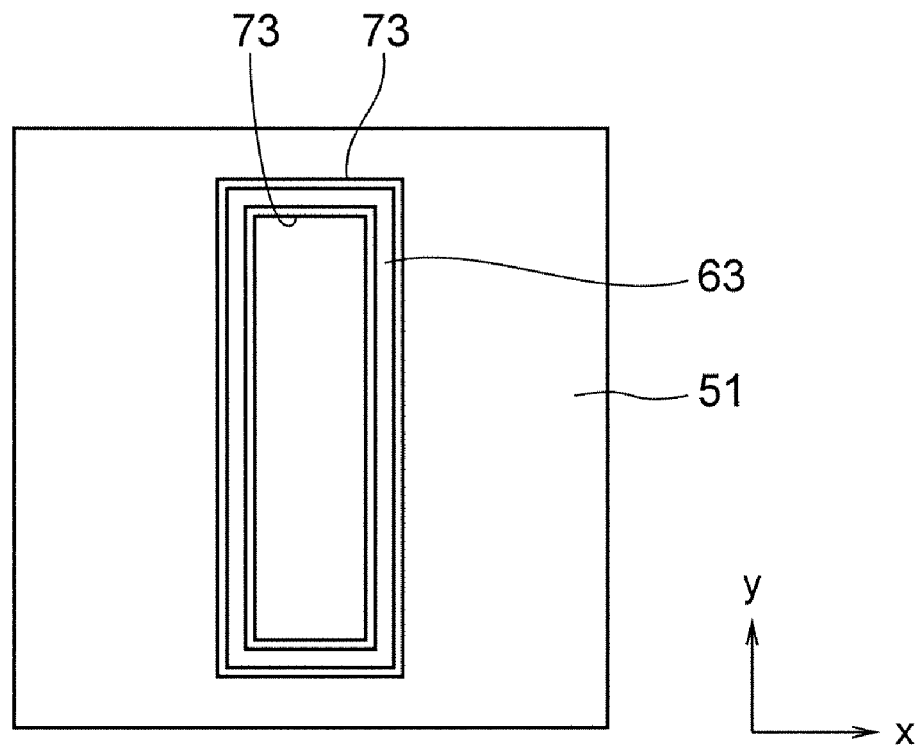
FIG. 17 is a partial plan view for explaining the manufacturing method of the semiconductor storage element depicted in FIG. 1.
Figure 18:
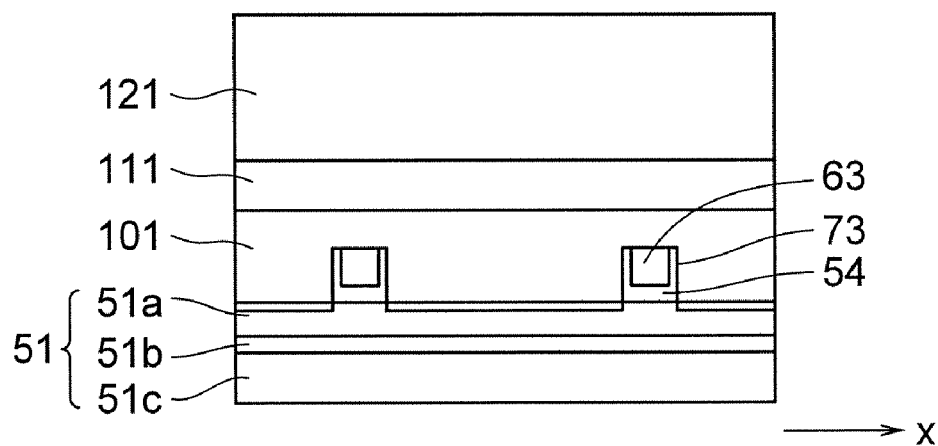
FIG. 18 is a partial cross-sectional view for explaining the manufacturing method of the semiconductor storage element depicted in FIG. 1.
Figure 19:
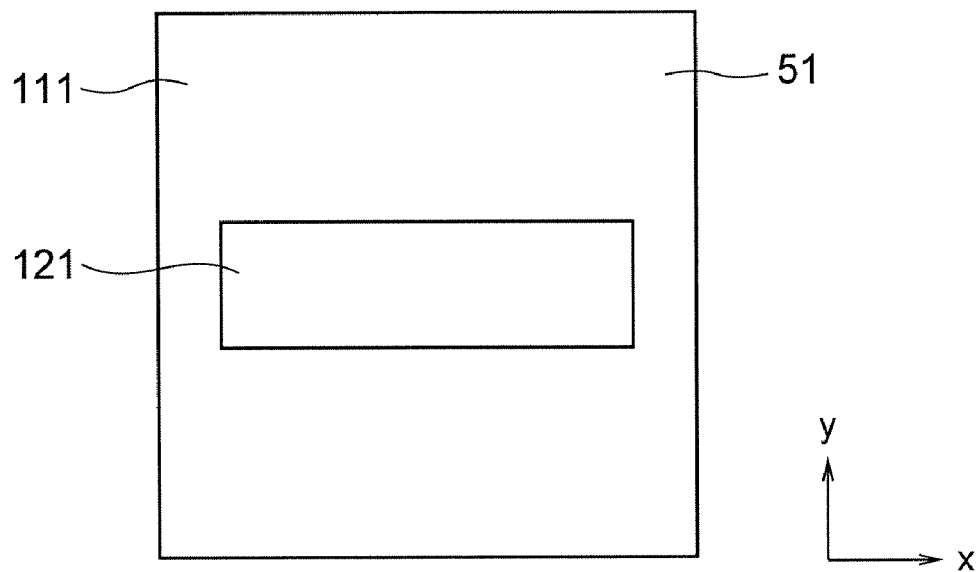
FIG. 19 is a partial plan view for explaining the manufacturing method of the semiconductor storage element depicted in FIG. 1.

Subsequently, as shown in FIG. 16, the mask material in the upper layer is removed from the nitride film 72 by wet etching. The polysilicon film (the thin line) 94 and the oxide film 161 on the nitride film 72 are also lifted off by selective etching of the nitride film 72. As a result, as shown in FIG. 17, a polysilicon thin line 63 which has a bottom surface and a side surface covered with the thermal oxide films 54 and 73 and has a rectangular planar shape with the y direction determined as its longitudinal direction can be obtained.

Thereafter, the same process as the sidewall manufacturing process is executed with a direction of the sidewall mask being rotated at 90°.

Specifically, after an insulating film (a BSG (Boron-Silicate Glass) film) is deposited on the element obtained by the process depicted from FIGS. 2 to 16, flattening is carried out to form a BSG film 101. It is preferable to form a film thickness of the BSG film 101 that is large so that a margin remains to prevent the quantum dot from being damaged at a subsequent etching step and that is also small so that adjustment of an etching rate does not become difficult. The film thickness of the BSG film 101 is set to 40 nm in this embodiment. Then, as shown in a cross-sectional view of FIG. 18, a nitride film 111 having a film thickness of 10 nm is formed, an insulating film (a TEOS film) is formed with a film thickness of 30 nm thereon, and a TEOS film 121 having a linear shape with a width of 50 nm is formed by patterning using a photoresist as shown in a plan view of FIG. 19. At this time, the TEOS film 121 is arranged in such a manner that the x direction perpendicular to the y direction as the longitudinal direction of the line pattern 81 in FIG. 5 becomes a longitudinal direction thereof. The x direction corresponds to, e.g., a second direction in this embodiment.

Figure 20:
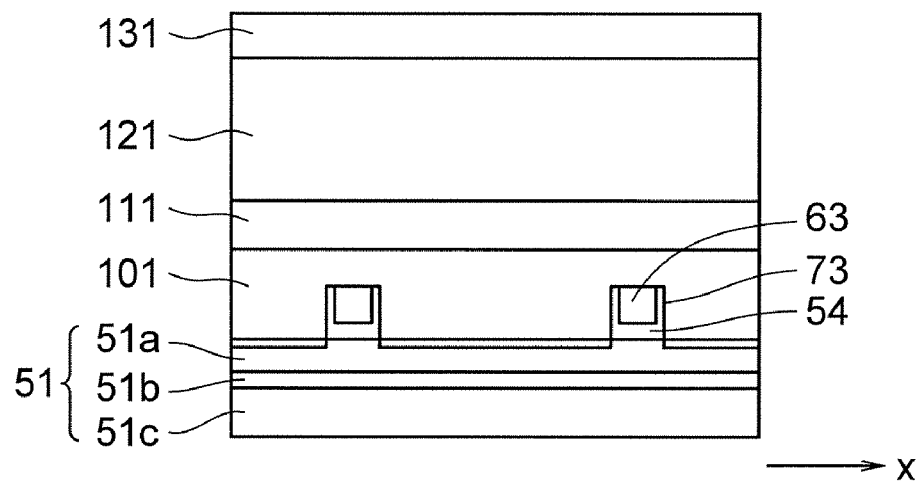
FIG. 20 is a partial cross-sectional view for explaining the manufacturing method of the semiconductor storage element depicted in FIG. 1.
Figure 21:
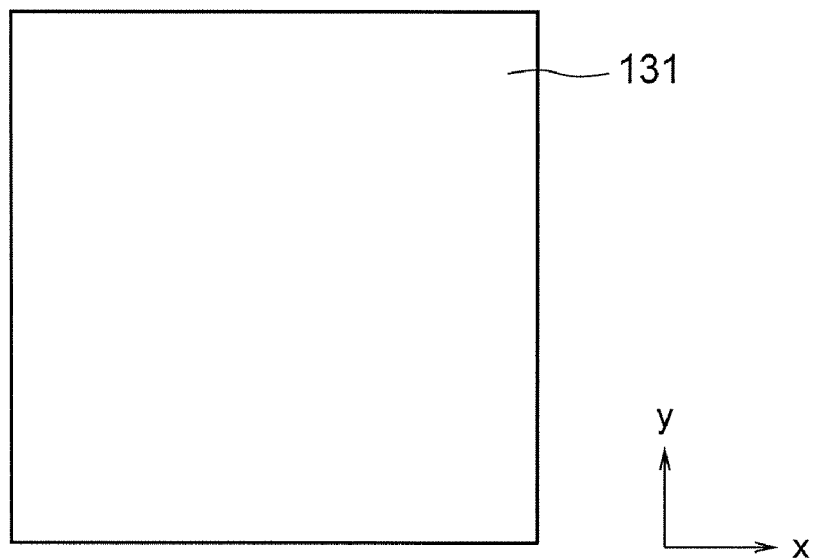
FIG. 21 is a partial plan view for explaining the manufacturing method of the semiconductor storage element depicted in FIG. 1.

Subsequently, as shown in a cross-sectional view of FIG. 20 and a plan view of FIG. 21, an amorphous silicon film 131 is formed on the TEOS film 121. As will be explained later, since the amorphous silicon film 131 serves as a mask material in sidewall processing, a size of the quantum dot in the y direction is determined by a film thickness of the amorphous silicon film 131 and subsequent thermal oxidation processing (see FIG. 32). In this embodiment, the amorphous silicon film 131 having a film thickness of 8 nm is formed.

Figure 22:
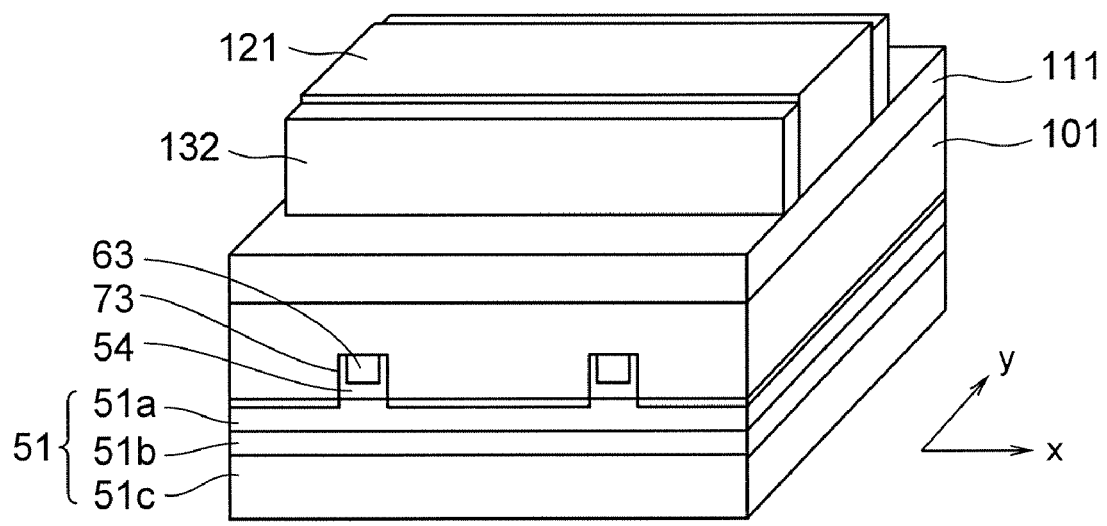
FIG. 22 is a partial perspective view for explaining the manufacturing method of the semiconductor storage element depicted in FIG. 1.
Figure 23:
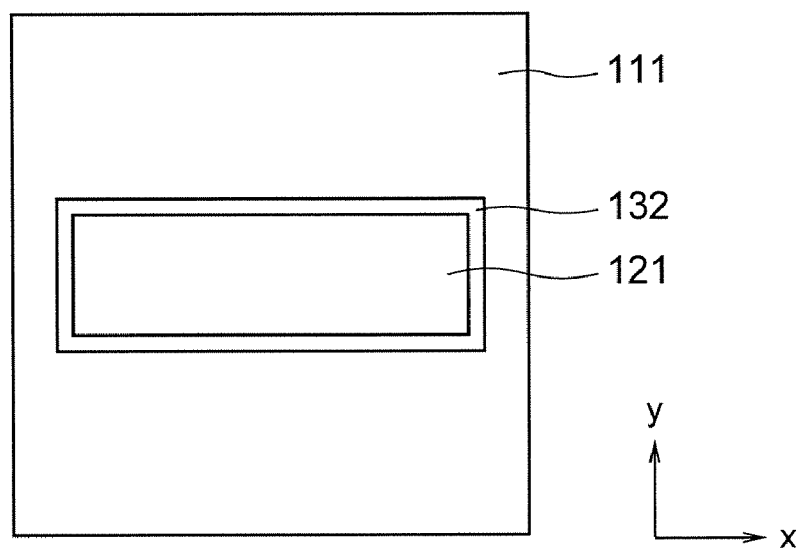
FIG. 23 is a partial plan view for explaining the manufacturing method of the semiconductor storage element depicted in FIG. 1.

Subsequently, as shown in a perspective view of FIG. 22, the amorphous silicon film 131 is selectively removed by anisotropic etching in such a manner that a sidewall part alone of the TEOS film 121 remains, thereby obtaining a sidewall film 132. FIG. 22 is an enlarged perspective view of a position at which the sidewall film 132 crosses the polysilicon thin line 63 and its peripheral part, and FIG. 23 is a plan view of the element at this stage. The sidewall film 132 serves as a mask in subsequent sidewall mask processing.

Figure 24:
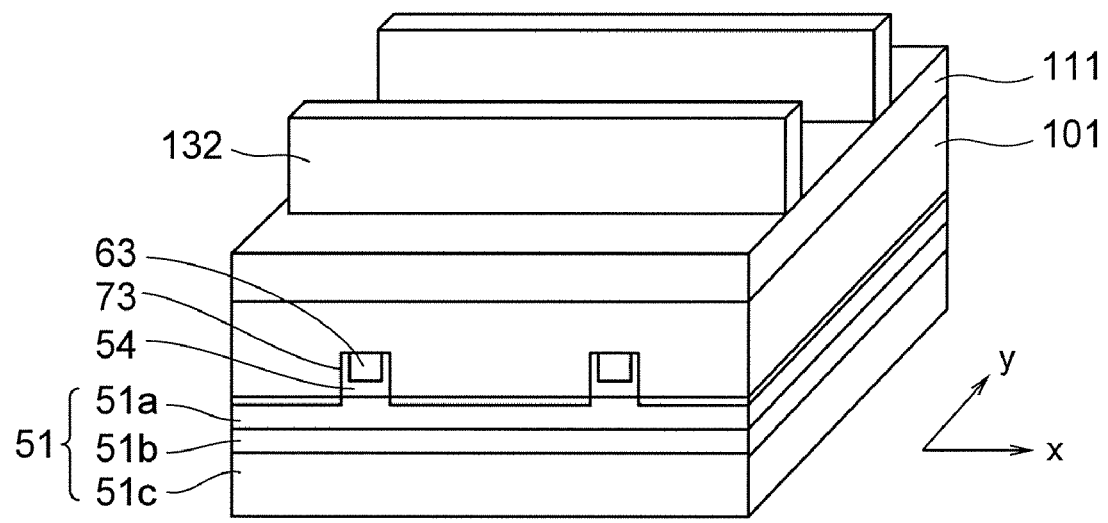
FIG. 24 is a partial perspective view for explaining the manufacturing method of the semiconductor storage element depicted in FIG. 1.
Figure 25:
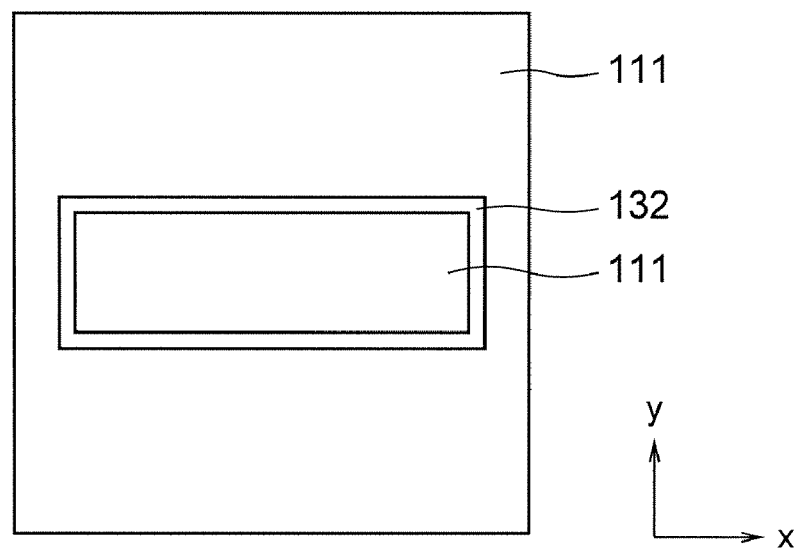
FIG. 25 is a partial plan view for explaining the manufacturing method of the semiconductor storage element depicted in FIG. 1.

Then, as shown in a perspective view of FIG. 24 and a plan view of FIG. 25, the TEOS film 121 is removed by wet etching. FIG. 24 is an enlarged perspective view of a position at which the sidewall film 132 crosses the polysilicon thin line 63 and its peripheral part, and FIG. 25 is a plan view of the element at this stage.

Figure 26:
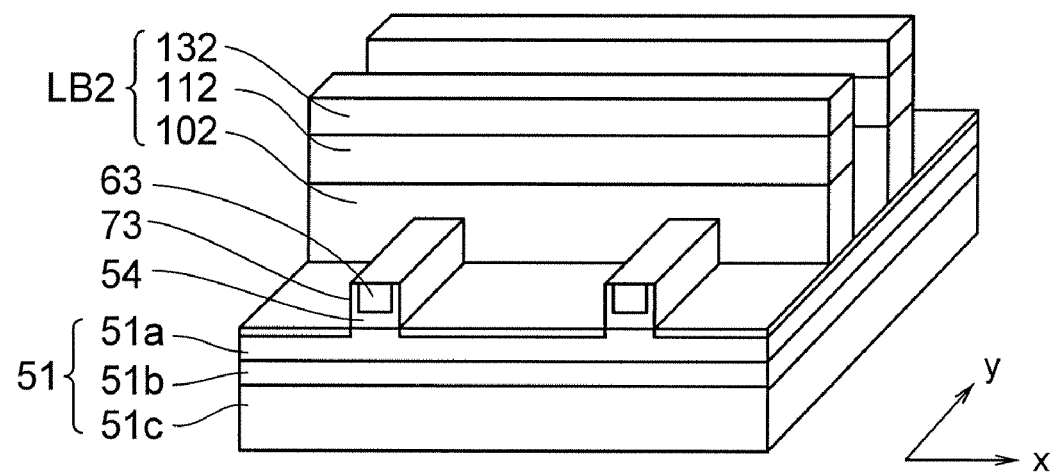
FIG. 26 is a partial perspective view for explaining the manufacturing method of the semiconductor storage element depicted in FIG. 1.
Figure 27:
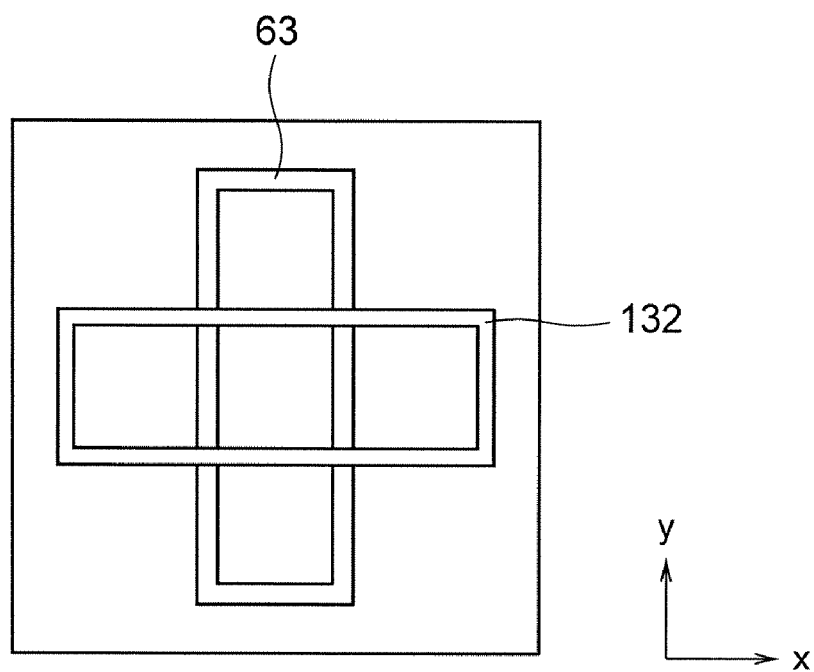
FIG. 27 is a partial plan view for explaining the manufacturing method of the semiconductor storage element depicted in FIG. 1.

Moreover, as shown in a perspective view of FIG. 26 and a plan view of FIG. 27, the nitride film 111 and the BSG film 101 are selectively removed by anisotropic etching using the sidewall film 132 as a mask, thereby obtaining a mask constituted of a laminated body LB 2 including a BSG film 102, a nitride film 112 and the sidewall film 132. As a result, the polysilicon thin line 63 and the mask constituted of the laminated body LB 2 cross each other at a central part to form a figure of a cross as seen in a plan view. FIG. 26 is an enlarged perspective view of a position at which the laminated body LB 2 crosses the polysilicon thin line 63 and its peripheral part, and FIG. 27 is a plan view of the element at this stage. At this moment, as shown in FIG. 26, the thin line structure of the polysilicon 63 is exposed from the underlying structure. In this sidewall mask processing, an etching selection ratio must be set in such a manner that the amorphous silicon sidewall film 132 and the nitride film 112 sufficiently remain as a mask material. Additionally, if such an etching selection ratio can be assured, a combination of the sidewall film 132 and the nitride film 112 may be substituted by a combination of films formed of other materials. The laminated body LB 2 corresponds to, e.g., a second frame body in this embodiment.

Figure 28:
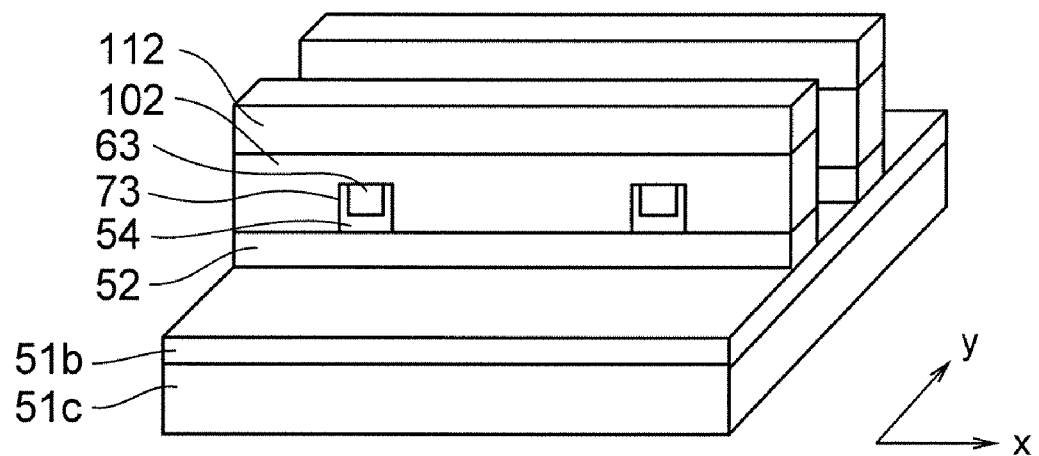
FIG. 28 is a partial perspective view for explaining the manufacturing method of the semiconductor storage element depicted in FIG. 1.
Figure 29:
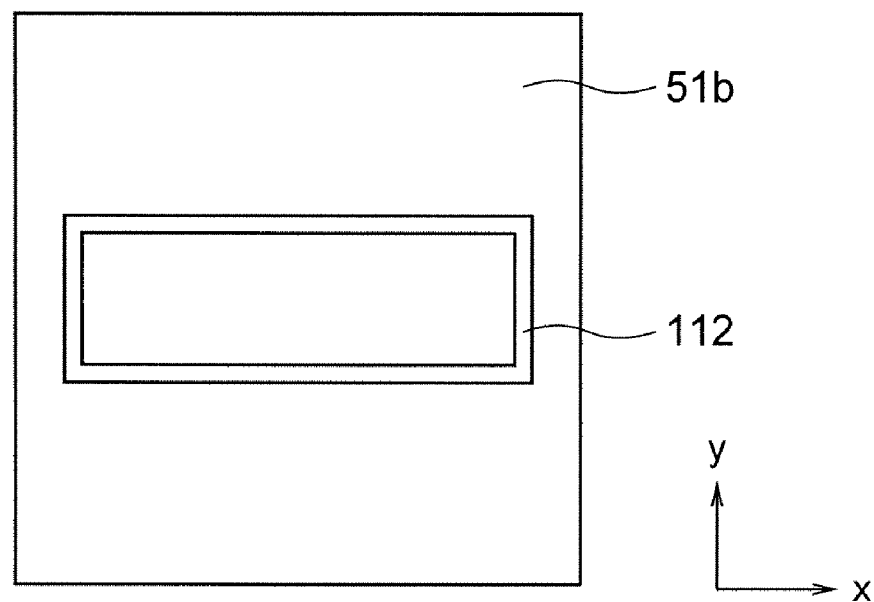
FIG. 29 is a partial plan view for explaining the manufacturing method of the semiconductor storage element depicted in FIG. 1.

Subsequently, the polysilicon 63, its sidewall oxide film 73 and an exposed part of the underlying silicon oxide film 54 are selectively removed by poly-based anisotropic etching using the laminated body LB 2 as a mask. At this time, the single-crystal silicon film 51a is also removed by using the laminated body LB 2 as the mask. As a result, a silicon thin line 52 is formed under a sidewall mask constituted of the BSG film 102 and the nitride film 112, and this serves as a channel region. FIG. 28 is an enlarged perspective view showing a position at which the laminated body LB 2, the silicon thin line 52 and the polysilicon thin line 63 cross each other together with the peripheral portion thereof, and FIG. 29 is a plan view showing the element at this stage.

Figure 30:
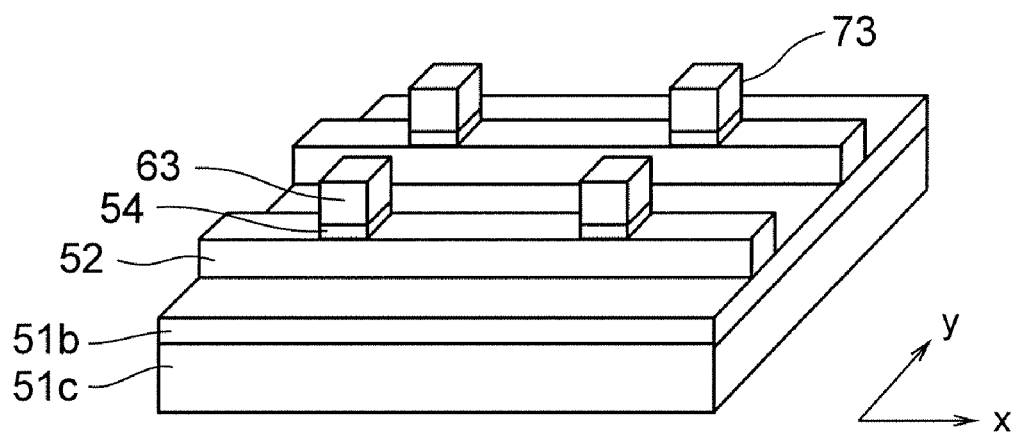
FIG. 30 is a partial perspective view for explaining the manufacturing method of the semiconductor storage element depicted in FIG. 1.
Figure 31:
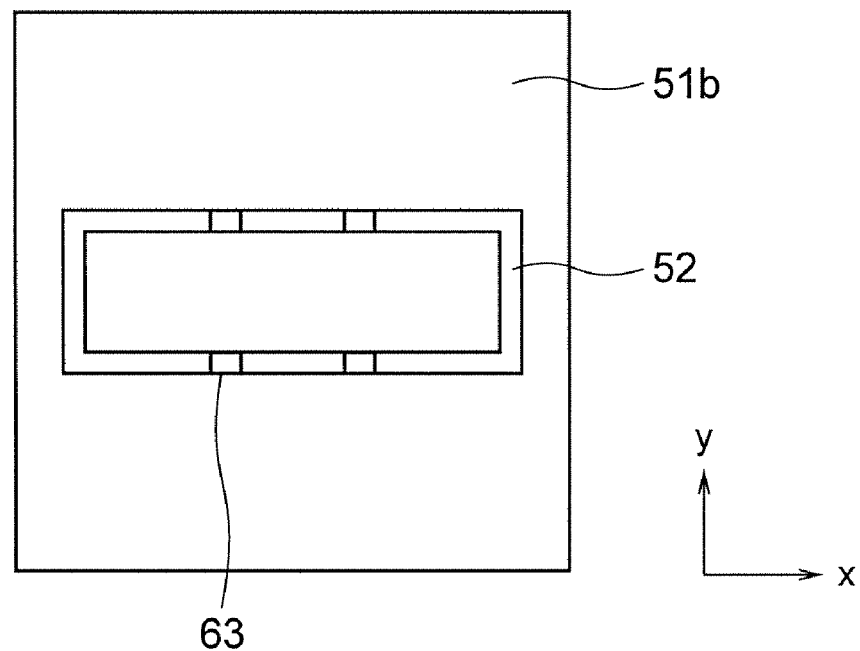
FIG. 31 is a partial plan view for explaining the manufacturing method of the semiconductor storage element depicted in FIG. 1.

Subsequently, the nitride film 112 is removed by selective wet etching, and the BSG film 102 is removed by selective wet etching. Consequently, as shown in a perspective view of FIG. 30, an element structure where dotted polysilicon pieces 64 to 67 are arranged on the silicon thin line 52 can be obtained. FIG. 30 is an enlarged view of the polysilicon pieces 64 to 67 on the silicon thin line 52 and their peripheral part. FIG. 31 is a plan view of this stage.

Figure 32:
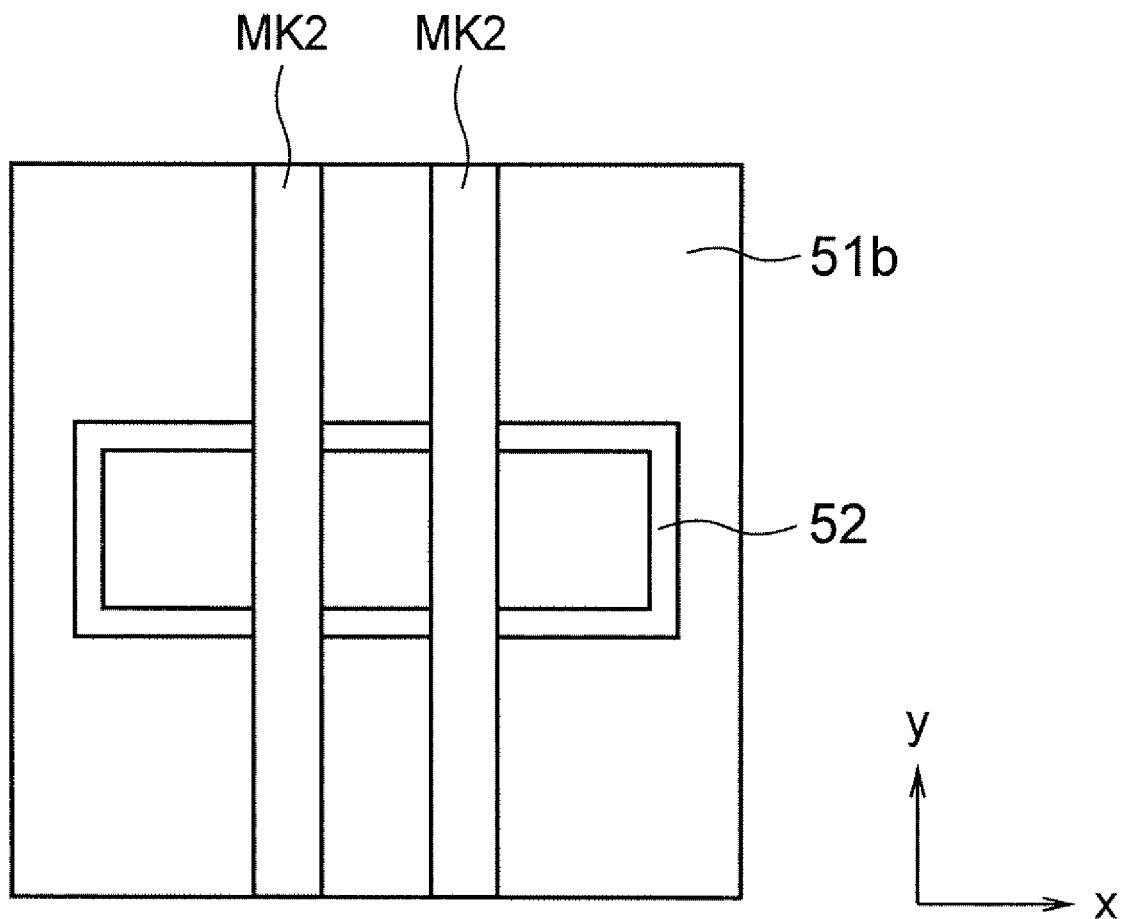
FIG. 32 is a partial plan view for explaining the manufacturing method of the semiconductor storage element depicted in FIG. 1.
Figure 33:
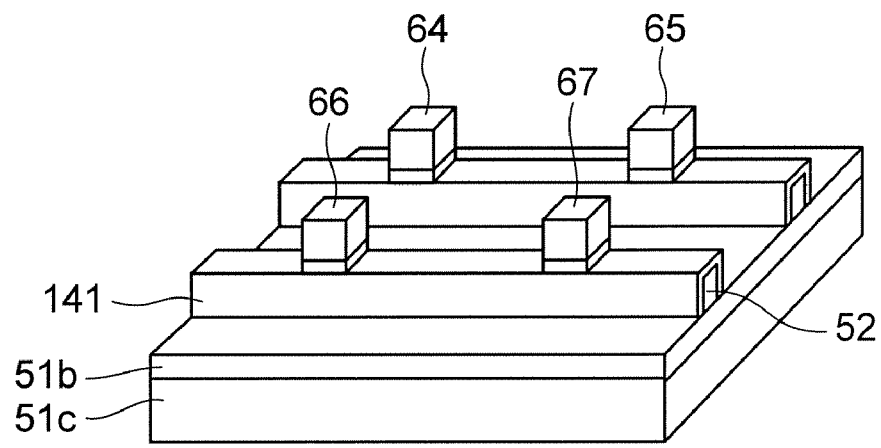
FIG. 33 is a partial perspective view for explaining the manufacturing method of the semiconductor storage element depicted in FIG. 1.
Figure 34:
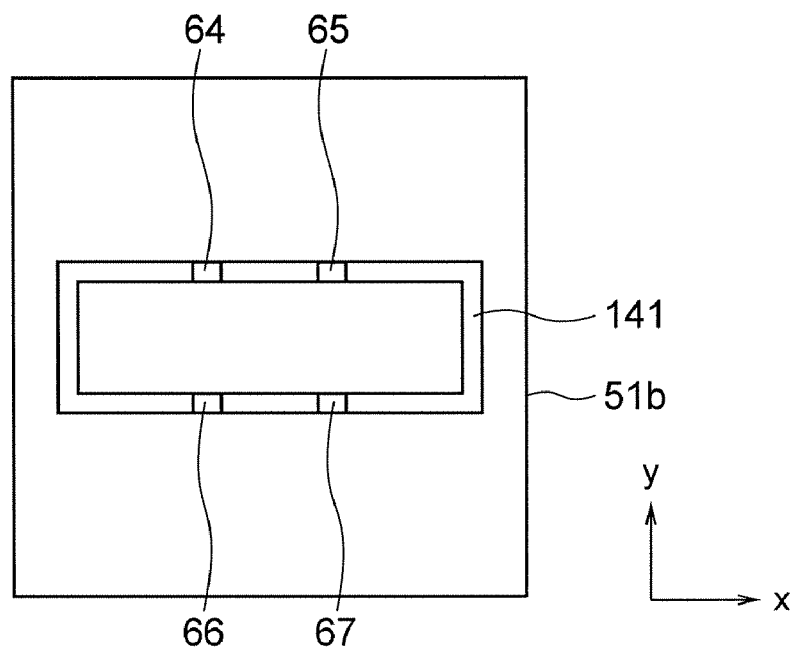
FIG. 34 is a partial plan view for explaining the manufacturing method of the semiconductor storage element depicted in FIG. 1.
Figure 35:
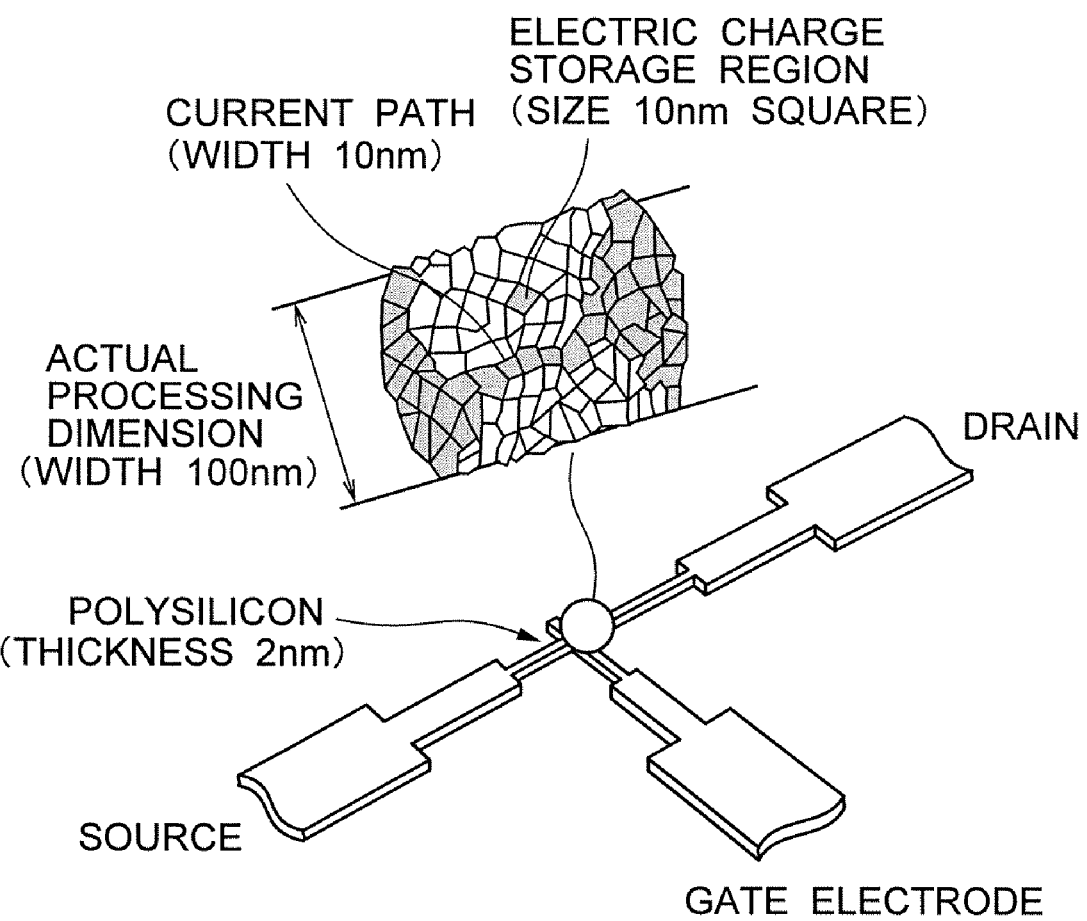
FIG. 35 is a view showing an outline structure of an example of a single-electron memory that operates at a room temperature according to a conventional technology.

Then, as shown in a plan view of FIG. 32, masks MK 2 covering the polysilicon pieces 64 to 67 are formed by patterning using a photoresist, and an impurity ion is implanted. Thereafter, thermal oxidation processing is carried out on the entire surface to cover the surface of the silicon thin line 52 and top faces of the polysilicon pieces 64 to 67 with an oxide film 141 as shown in FIGS. 33 and 34. FIG. 33 is an enlarged perspective view of the polysilicon pieces 64 to 67 covered with the oxide film 141 and their peripheral part, and FIG. 29 is a plan view of the element at this stage. Here, when a thickness of the thermal oxide film 141 is set to 3 nm, each of the polysilicon pieces 64 to 67 forming the quantum dots has a size of 5 nm in both the x and y directions and 3.5 nm in a height direction. Further, since an outer periphery of the silicon thin film 51a is also oxidized, the channel region becomes the narrower thin line 52. Furthermore, thermal oxidation processing at this time functions as annealing processing to simultaneously activate the impurity ion, thereby forming impurity diffusion layers 27 to 34 (see FIG. 1). As a result, four memory cells in which sources/drains 27 to 34 are respectively formed in the silicon thin line 52 so as to sandwich the channel region below the quantum dots 64 to 67 serving as electric charge storage layers can be obtained.

Then, an electroconductive film is formed, and then gate electrodes 41 to 44 respectively covering the quantum dots 64 to 66 are formed by patterning using a resist. Subsequently, an element isolation groove Gr (see FIG. 1) is formed by etching in such a manner that combinations of the respective quantum dots and the impurity diffusion regions formed to sandwich the regions below these dots are separated from each other as independent memory cells, thereby cutting the thin line portion 52. Filling the element isolation groove Gr with an insulating film enables forming an element isolation insulating film 151, thus separating the four memory cells from other elements. Thereafter, an interlayer insulating film is formed on the entire surface, contacts reaching the impurity diffusing regions forming the sources/drains are formed to bury the electroconductive film, thereby obtaining the semiconductor storage element 1 depicted in FIG. 1.

According to the manufacturing method of the semiconductor storage element, a size of each of the quantum dots 64 to 67 is determined by a film thickness of the mask material of the sidewall processing mask and a thermal oxidation amount without being dependent on a resolution of lithography. As to the mask material of the sidewall processing mask, a film of several nm can be uniformly formed by the current process technology, and an oxidation amount by thermal oxidation can be controlled in units of several nm. Therefore, using the manufacturing method according to this embodiment enables manufacturing the mass-producible semiconductor storage element including the quantum dots of a non scale by the current mass production process technology with a low manufacturing cost, a high throughput and stable uniformity.

Moreover, since a distance between the quantum dots can be controlled based on lithography, the quantum dots can be regularly arranged by using the current lithography technology. In this point, this embodiment is suitable for mass production as compared with a method that is dependent on self-growth of the quantum dots or a method that randomly forms quantum dots regions like the conventional examples. Additionally, unevenness in lithography affects a distance between the quantum dots but does not affect a size of each quantum dot that determines a quantum effect. Therefore, unevenness in lithography does not give a serious influence on element characteristics.

What is claimed is:
1. A semiconductor storage element comprising:
   a semiconductor layer formed on a substrate as a line pattern with a finite width;
   a plurality of memory cells, each of the memory cells including portions of the line pattern, the memory cells comprising:
      a tunnel insulting film;
      a quantum dot formed on at least one portion of the line pattern through the tunnel insulating film,
      impurity diffusion layers formed in a surface layer of the at least one portion of the line pattern so as to sandwich a region of the semiconductor layer below the quantum dot,
      a second insulating film, and
      a control electrode formed on the quantum dot through the second insulating film,
   wherein each quantum dot serves as an electric charge storage layer for respective ones of the memory cells, and
   wherein the line pattern of at least two of the memory cells comprises a first portion and a second portion provided at different orientations on the surface of the semiconductor layer.
2. The semiconductor storage element according to claim 1, at least one quantum dot further comprising a thermal oxide film formed on a sidewall of the at least one quantum dot.
3. The semiconductor storage element according to claim 1,
   wherein the substrate is a silicon substrate.
4. The semiconductor storage element according to claim 1, further comprising a shallow trench insulator (STI) for element isolation formed on a surface layer of the substrate,
   wherein the quantum dot is formed in an element region defined by the STI.

5. The semiconductor storage element according to claim 1,
   wherein the width of the line pattern is defined based on a nano scale.

6. The semiconductor storage element according to claim 1,
   wherein the substrate is a silicon-on-insulator (SOI) substrate and the quantum dot is formed on the silicon-on-insulator (SOI) substrate.

* * * * *